(12) United States Patent
Kim et al.

(10) Patent No.: US 7,411,225 B2
(45) Date of Patent: *Aug. 12, 2008

(54) LIGHT SOURCE APPARATUS

(75) Inventors: Geun-Ho Kim, Seoul (KR); Ki-Chang Song, Gyeonggi-Do (KR); Sun-Ho Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 303 days.

This patent is subject to a terminal disclaimer.

(21) Appl. No.: 11/086,186

(22) Filed: Mar. 21, 2005

(65) Prior Publication Data

US 2006/0208271 A1   Sep. 21, 2006

(51) Int. Cl.
*H01L 33/00* (2006.01)

(52) U.S. Cl. .................. 257/100; 257/98; 257/99; 257/102; 257/E33.056; 257/E33.057; 257/E33.058; 257/E33.059; 257/E25.032; 257/778

(58) Field of Classification Search .............. 257/98, 257/99, 100, 292
See application file for complete search history.

(56) References Cited

U.S. PATENT DOCUMENTS

| | | | |
|---|---|---|---|
| 4,797,715 A | 1/1989 | Thillays et al. | |
| 5,879,572 A | 3/1999 | Folsom et al. | |
| 6,498,355 B1 * | 12/2002 | Harrah et al. | ................. 257/99 |
| 6,507,049 B1 | 1/2003 | Yeager et al. | |
| 6,531,328 B1 | 3/2003 | Chen | |
| 6,599,768 B1 | 7/2003 | Chen | |
| 2005/0035363 A1 | 2/2005 | Okazaki et al. | |

FOREIGN PATENT DOCUMENTS

JP   09045965   2/1997

* cited by examiner

*Primary Examiner*—Lynne A. Gurley
*Assistant Examiner*—Samuel A. Gebremariam
(74) *Attorney, Agent, or Firm*—Lee, Hong, Degerman, Kang & Schmadeka

(57) ABSTRACT

A light source apparatus and a fabrication method thereof can prevent light interference between light emitting devices adjacent to each other by forming a groove in a sub-mount and bonding a light emitting device to the groove, enhance heat radiating effect as well as luminous efficiency by collecting light emitted from the side of the light emitting device toward the front of the light source apparatus, reduce the process time and costs and increase reliability by directly connecting the sub-mount to the stem by the first electrode and the second electrode which pass through holes of the sub-mount, and extend a life span of the light emitting device because of the enhanced heat radiating effect.

10 Claims, 9 Drawing Sheets

LIGHT SOURCE APPARATUS

BACKGROUND OF THE INVENTION

1. Field of the Invention

The present invention relates to a light source apparatus and a fabrication method thereof, and more particularly, to a light source apparatus and a fabrication method thereof capable of not only collecting light emitted from the front of a stem without losing light emitted from each light emitting device but also easily bonding a sub-mount to the stem by forming through holes on the sub-mount.

2. Description of the Background Art

A light emitting device which is currently and actively being used is typically divided into a laser diode (LD) and a light emitting diode (LED).

The LD is being widely used as a light source in the field of optical communication, and has lately been used as an important component in the field of optical media such as a DVD player, a laser disc (LD) player, a mini disc (MD) player, or the like as well as in the filed of a compact disc (CD) player and a compact disc rewritable (CD-RW) player.

In addition, the LED is widely used in a backlight unit (BLU), and is used as a light source apparatus which is located at a lower portion of an LCD PANEL which cannot emit by itself and allows an LCD to be recognized by irradiating uniform plane light.

Advantageously, the LED can be operated at a relatively low voltage, generates less heat because of high energy efficiency and has a long life span.

FIG. 1 is a longitudinal sectional view showing the conventional light emitting device, and FIG. 2 is a longitudinal sectional view showing the conventional light source apparatus.

As shown in FIG. 1, the conventional light emitting device 10 is constructed in such a manner that a buffer layer 12, an n-contact layer 13, an active layer 14 and a p-contact layer 15 are sequentially deposited over a sapphire, n-GaAs or other substrate 11 by a chemical vapor deposition (CVD) method.

A current spraying layer 16 is formed on an upper surface of the p-contact layer 15. A p-electrode 17 electrically which connects with the p-contact layer 15 and the current spraying layer 16 is formed on an upper surface of the current spraying layer 16. Next, an n-electrode 18 is formed on an upper surface of an exposed portion of the n-contact layer 13.

As shown in FIG. 2, in the conventional light source apparatus 40, the light emitting device 10 is bonded to a sub-mount 20 by a wire bonding method, and the sub-mount 20 is bonded to a stem 30. At this time, the p-electrode 17 of the light emitting device 10 connects with an electrode 21 of the sub-mount 20 by a wire 17a in order to apply an external power source, and the electrode 21 of the sub-mount 20 connects with an electrode 31 of the stem 30 by another wire 22. Since the n-electrode 18 has the same structure as the p-electrode 17, a description for a connection structure of the n-electrode 18 will be omitted hereinafter.

An operation of the conventional light source apparatus having such a construction will be described as follows.

As shown in FIGS. 1 and 2, when a voltage is applied to the electrode 31 of the stem 30, a current is applied to the p-electrode 17 and the n-electrode 18 through wires 17a and 22.

At this time, holes and electrons are injected into the p-electrode 17 and the n-electrode 18, respectively. The injected holes and electrons are introduced into the p-contact layer 15 and the n-contact layer 13 and then are recombined in the active layer 14. At this time, extra energy is changed into light, which is emitted.

However, since the conventional light source apparatus uses a light emitting device by directly attaching the light emitting device in the form of a chip to a stem, a printed circuit board, a precise wire boding procedure is required and thus the reliability is lowered.

In addition, in case of a light source apparatus in which a light emitting device is attached to a sub-mount and then the sub-mount is attached to a stem, light interference between the light emitting devices adjacent to each other occurs or light emitted from the side of the light emitting device is not collected toward the front of the stem but disperses in all directions, thereby decreasing luminous efficiency.

In addition, since a wire bonding method is used in electrically connecting the sub-mount with the stem in order to supply an external power source, a defective rate is high, process compatibility with other components is difficult because of wires, a long time is taken to process, and product reliability is deteriorated.

Moreover, since heat generated from the light emitting device is transmitted to the stem through the sub-mount, heat generation is delayed to thereby reduce a life span of the light emitting device, the work of the assembly and productivity are deteriorated.

SUMMARY OF THE INVENTION

Therefore, an object of the present invention is to provide a light source apparatus and a fabrication method thereof capable of preventing light interference between light emitting devices adjacent to each other by forming a groove in a sub-mount and mounting the light emitting device into the groove, and enhancing heat radiating effect as well as luminous efficiency by collecting light emitted from the side of the light emitting device toward the front of the stem.

Another object of the present invention is to provide a light source apparatus and a fabrication method thereof capable of increasing operability and improving productivity by bonding the sub-mount to a stem by a flip chip bonding method.

To achieve these and other advantages and in accordance with the purpose of the present invention, as embodied and broadly described herein, there is provided a light source apparatus comprising: a stem having a line pattern electrode at its one surface; a sub-mount provided with a body having a groove at its one surface and through holes formed inside the groove, a first electrode penetrating the through holes and formed at one surface of the body, a second electrode formed at the other side of the body so as to electrically connect with the first electrode and the line pattern electrode, and a solder layer formed on the first electrode; and a light emitting device inserted into the groove and bonded to the solder layer of the sub-mount.

Preferably, the depth of the groove is greater relatively to the height (length) of the light emitting device.

Preferably, the stem is an MC PCB (Metal Core Printed Circuit Board), and the light emitting device is an LED.

The insulation layer is deposited over the stem and the sub-mount is bonded to the insulation layer.

Inclined surfaces are formed inside the groove such that light emitted from the side of the light emitting device can be collected toward the front of the stem.

Meanwhile, to achieve these and other advantages and in accordance with the purpose of the present invention, as embodied and broadly described herein, there is provided a method for fabricating the light source apparatus, comprising: forming a plurality of grooves on a silicon substrate at regular intervals; forming through holes on the silicon substrate on which the grooves are formed; forming a first electrode on one surface of the silicon substrate having the grooves and forming a solder layer on the first electrode; forming a second electrode at the other surface of the silicon substrate such that the second electrode can penetrate through the through holes and electrically connect with the first electrode and a line pattern electrode; bonding the light emitting device to the solder layer; forming the line pattern electrode in which a metal line is patterned to allow an electrical connection at one side of a stem; and completing a light source apparatus by bonding each sub-mount to the stem such that the line pattern electrode can connect with the second electrode.

In the step of forming the groove and the through holes, after the groove is formed by bulk-etching a part of one side of the silicon substrate, the silicon substrate is dry-etched to thereby form the through holes on the silicon substrate by using a first photoresist, a second photoresist and an etching mask.

After the step of forming the through holes, a reflective layer and an insulation layer are sequentially formed on the silicon substrate.

Inclined surfaces are formed inside the groove, and light emitted from the side of the light emitting device is collected toward the front of the stem by forming a reflective layer formed along the inclined surfaces.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Hereinafter, a light source apparatus and a fabrication method thereof in accordance with the present invention will be described as follows.

Figure 1:
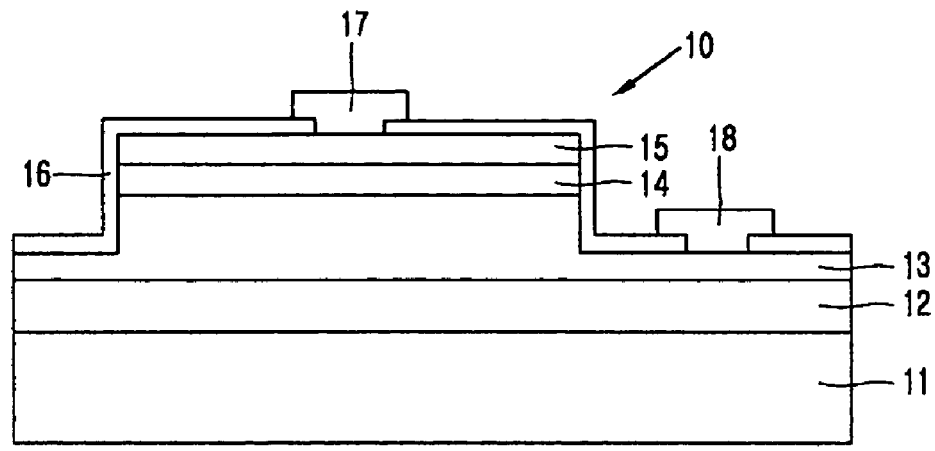
FIG. 1 is a longitudinal sectional view showing the conventional light emitting device.
Figure 2:
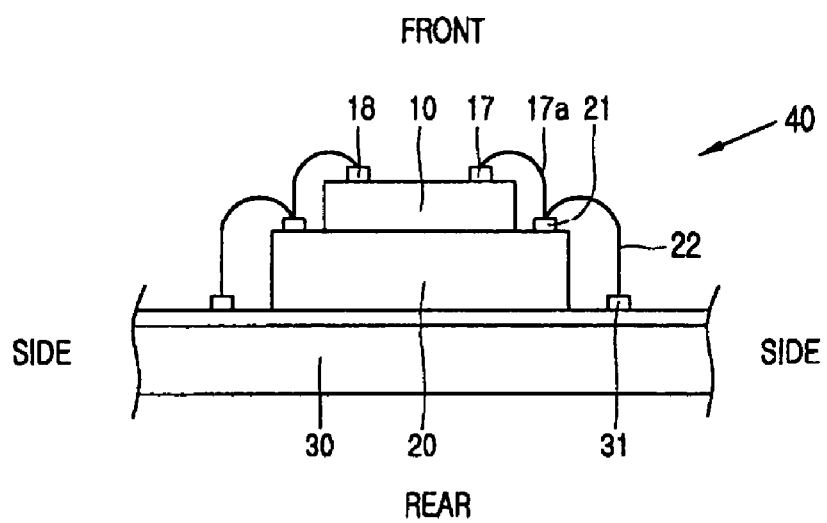
FIG. 2 is a longitudinal sectional view showing the conventional light source apparatus.
Figure 3:
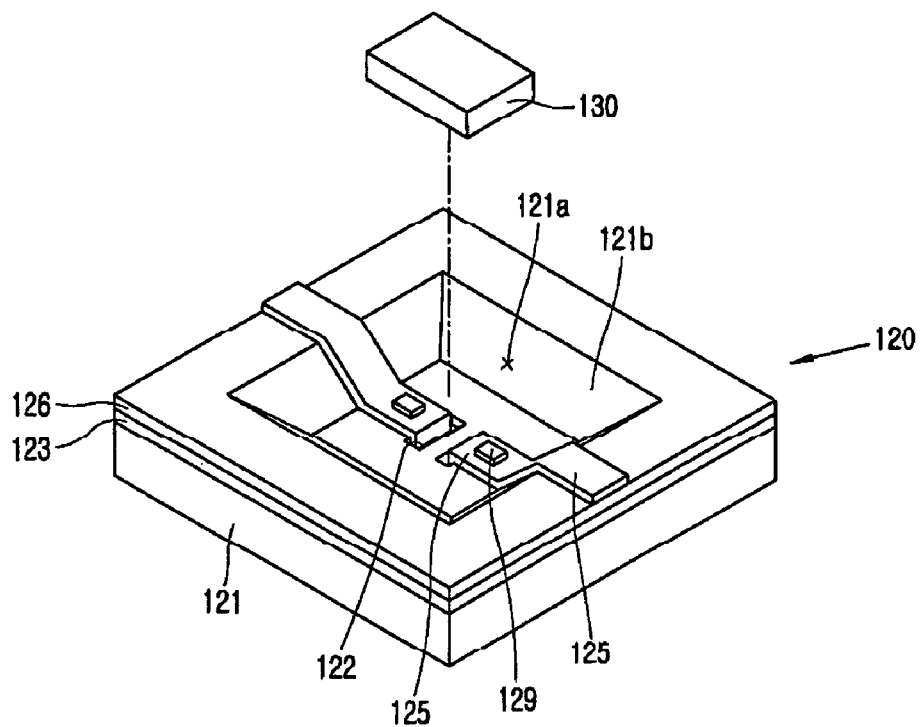
FIG. 3 is an exploded perspective view illustrating a sub-mount and a light emitting device of a light source apparatus in accordance with a first embodiment of the present invention.
Figure 4:
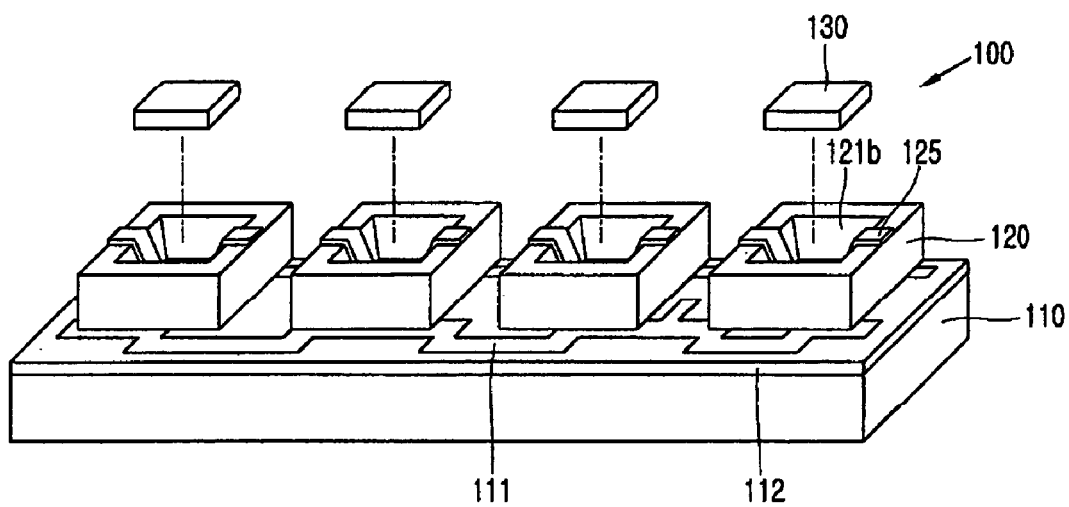
FIG. 4 is an exploded perspective view illustrating the light source apparatus in accordance with the first embodiment of the present invention.
Figure 5:
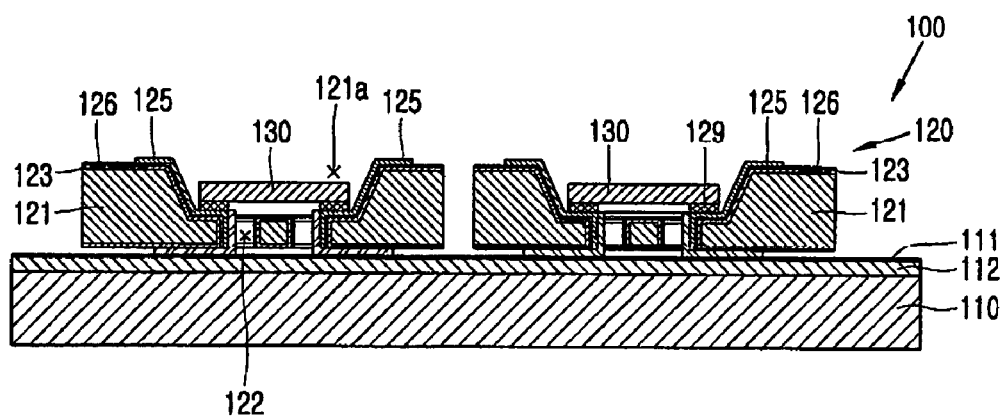
FIG. 5 is an exploded perspective view illustrating the light source apparatus in accordance with the first embodiment of the present invention.

FIG. 3 is an exploded perspective view illustrating a sub-mount and a light emitting device of a light source apparatus in accordance with a first embodiment of the present invention, FIG. 4 is an exploded perspective view illustrating the light source apparatus in accordance with the first embodiment of the present invention, and FIG. 5 is an exploded perspective view illustrating the light source apparatus in accordance with the first embodiment of the present invention.

As shown therein, a light source apparatus 100 in accordance with a first embodiment of the present invention includes: a stem 110 having a line pattern electrode 111 at its one surface; a sub-mount 120 provided with a body 121 having a groove 121a at its one surface and through holes 122 inside the groove 121a, a first electrode 125 penetrating the through holes 122 and formed at one surface of the body 121, a second electrode 127 formed at the other side of the body 121 so as to electrically connect with the first electrode 125 and the line pattern electrode 111, and a solder layer 129 formed on the first electrode 125; and a light emitting device 130 inserted into the groove 121a and bonded to the solder layer 129 of the sub-mount 120.

Preferably, a reflective layer 123 and an insulation layer 126 are sequentially formed on the sub-mount 120 before forming the first electrode 125.

On the other hand, as for an order of laminating the reflective layer 123 and the insulation layer 125, the insulation layer 126 and the reflective layer 123 may be sequentially formed in a structure where the first electrode 125 and the second electrode 127 electrically connect with each other.

Here, the first electrode 125 and the second electrode 127 are preferably formed at a part of the insulation layer 126.

The light source apparatus 100 in accordance with the first embodiment of the present invention can increase luminous efficiency of the light emitting device 130 by sending light emitted from the side as well as the front of the light emitting device 130 toward the front of the stem 110 by forming the groove 121a at one surface of the sub-mount 120 so as to mount the light emitting device 130 and forming the reflective layer 123 on the sub-mount 120. In addition, the sub-mount 120 becomes as thin as the groove 121a formed at the sub-mount 120, thereby facilitating heat generation of the light emitting device 130.

The reflective layer 123 is formed by a vapor deposition method or a lift off method, and uses a material having a high reflection coefficient such as Ag or Al, preferably.

Any material having insulating properties is allowable as a material of the insulation layer 126, but one of AlN, ZnO, BeO, $SIO_2$ and SiNx is preferably used by a sputtering method or the vapor deposition method. In addition, an insulating layer used in a semiconductor process such as a silicon nitride layer can be used.

Preferably, the solder layer 129 uses a material which can be bonded with the melting point of less than 400° C., for example, Au—Sn, In, Pb, Pb—Sn or Ag—Sn.

Preferably, the depth (D) of the groove 121a is greater relatively to the height (or length) of the light emitting device 130.

That is, only if the depth (D) of the groove 121a is grater relatively to the height (or length) of the light emitting device 130, light emitted from the side of the light emitting device 130 does not disperse but reflect from the reflective layer 123 and therefore can be collected toward the front of the stem 110.

Inclined surfaces 121b are formed inside the groove 121a in order that light emitted from the side of the light emitting device 130 can be collected toward the front of the stem 110, and the reflective layer 123 is deposited along the inclined surfaces 121a.

The insulation layer 112 is deposited over the stem 110 and the sub-mount 120 is bonded to the insulation layer 112, whereby the insulation layer 112 insulates the stem 110 from the sub-mount 120.

The stem 110 is preferably formed of an MC PCB (Metal Core Printed Circuit Board) having superior heat release properties. The MC PCB quickly absorbs heat generated from the light emitting device 130 and emits the heat, thereby allowing the light emitting device 130 to smoothly emit light and extending the life span of the light emitting device 130.

The light source apparatus in accordance with the first embodiment of the present invention has a structure that the light emitting device 130 connects with the sub-mount 120 and the sub-mount 120 connects with the stem 110 by using a flip chip bonding method wherein two electrodes face each other and are bonded.

In other words, the through holes 122 are formed at the center of the body 121 of the sub-mount 120, the first electrode 125 is formed at one surface of the body 121, and the second electrode 127 connecting with the first electrode 125 and simultaneously with the line pattern electrode 111 is formed at the other surface of the body 121, whereby the sub-mount 120 can easily connect with the stem 110 by using the flip chip bonding method instead of using the wire bonding method.

An operation of the light source apparatus in accordance with the first embodiment of the present invention having such a construction will be described as follows.

As shown in FIGS. 3 to 5, when an electric voltage is applied to the line pattern electrode 111 of the stem 100, a electric current passes by the second electrode 127 and the first electrode 125 to the light emitting device 130.

At this time, holes and electrons injected through an electrode 131 are recombined in an active layer (not shown) of the light emitting device 130. At this time, extra energy is changed into light, which is emitted.

At this time, since the light emitting device 130 is mounted into the groove 121a, light interference between light emitting devices 130 adjacent to each other can be effectively prevented.

In addition, because of the reflective layer 123, light emitted from the side as well as the front of the light emitting device 130 does not disperse but is collected toward the front of the stem 100 to thereby increase the luminous efficiency of the light emitting device.

In addition, since the first electrode 125 connects with the second electrode 127 through the through holes 122 formed in the groove 121a of the sub-mount 120, the sub-mount 120 is easily bonded to the stem 110 by the flip chip bonding method, thereby facilitating an assembling procedure and improving productivity.

Meanwhile, a method of fabricating the light source apparatus in accordance with the first embodiment comprises: forming a plurality of grooves 121a on a silicon substrate 120' at regular intervals; forming through holes 122 on the silicon substrate 120' having the grooves 121a; forming a first electrode 125 on one surface of the silicon substrate 120' having the grooves 121a, and forming a solder layer 129 on the first electrode 125; forming a second electrode 127 at the other surface of the silicon substrate 120', the second electrode 127 penetrating through the through holes 122 and connecting with the first electrode 125 and a line pattern electrode 111; bonding the light emitting device 130 to the solder layer 129; forming the line pattern electrode 111 in which a metal line is patterned to allow an electrical connection at one side of a stem 110; and completing a light source apparatus 100 by bonding each sub-mount 120 to the stem 110 such that the line pattern electrode 111 can connect with the second electrode 127.

The method of fabricating the light source apparatus in accordance with the first embodiment will be described in detail.

Figure 6:
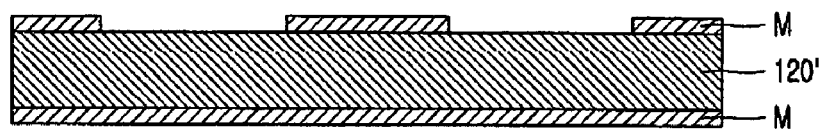
FIGS. 6 to 13 show a sequential process of a method for fabricating a light source apparatus in accordance with a first embodiment of the present invention.
Figure 7:
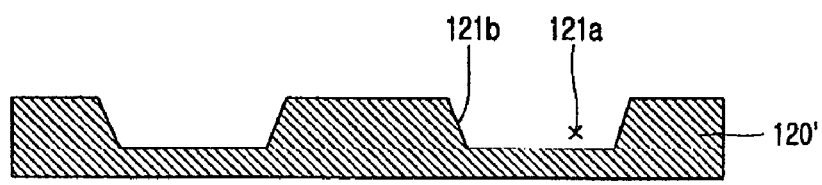

First, as shown in FIGS. 6 and 7, after a plurality of grooves 121a are formed at one surface of the silicon substrate 120' at regular intervals by using an etching mask (M), the etching mask (M) is removed. At this time, the inclined surfaces 121b are formed in the groove 121a.

Figure 8:
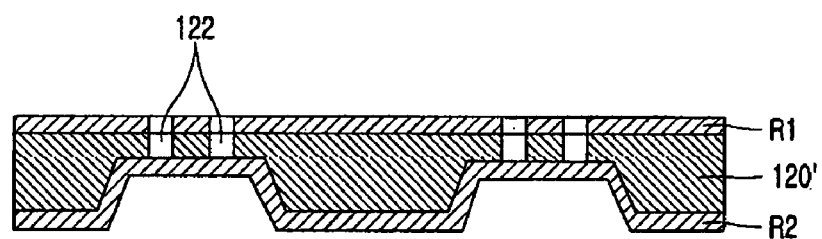
Figure 9:
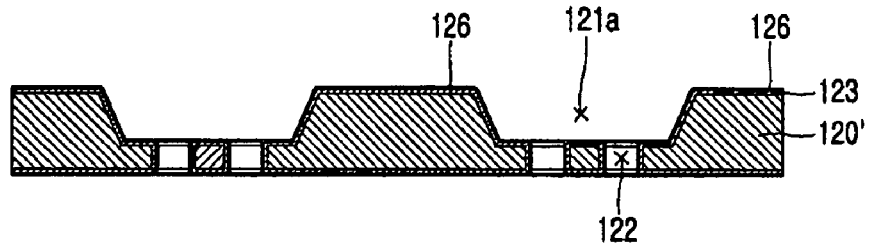

Next, as shown in FIG. 8, the silicon substrate 120' are dry-etched by using a first photoresist (R1), a second photoresist (R2) and an etching mask (not shown) to thereby form the through holes 122.

Here, deep-reactive ion etching is used as the dry etching, preferably.

After the step of forming the through holes, the insulation layer 126 is formed to electrically insulate the silicon substrate 120' from the first electrode 125 and the second electrode 126 to be formed later, preferably. In addition, the reflective layer 123 is formed to collect light generated from the front and the side of the light emitting device 130 toward the front of the stem 110.

Figure 10:
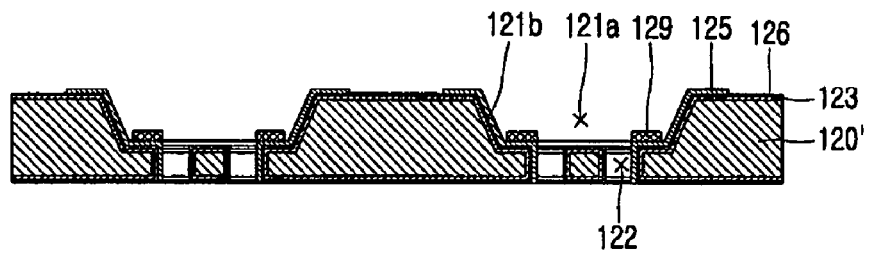

Next, as shown in FIG. 10, the first electrode 125 is formed at one surface of the silicon substrate 120' at which the groove 121a is formed, and the solder layer 129 is formed at the first electrode 125. At this time, the first electrode 125 is formed on a part of the insulation layer 126, preferably.

One of Au—Sn, In, Pb and Pb—Sn is used as the solder layer 129 in order to electrically connect the electrode 131 of the light emitting device 130 with the first electrode 125.

Figure 11:
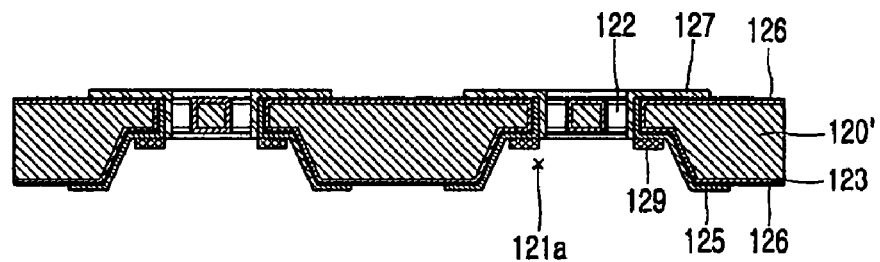

Next, as shown in FIG. 11, the second electrode 127 is formed at the other surface of the silicon substrate 120' through the through hole 122 by flipping over the silicon substrate 120' in order to electrically connect with the first electrode 125.

Figure 12:
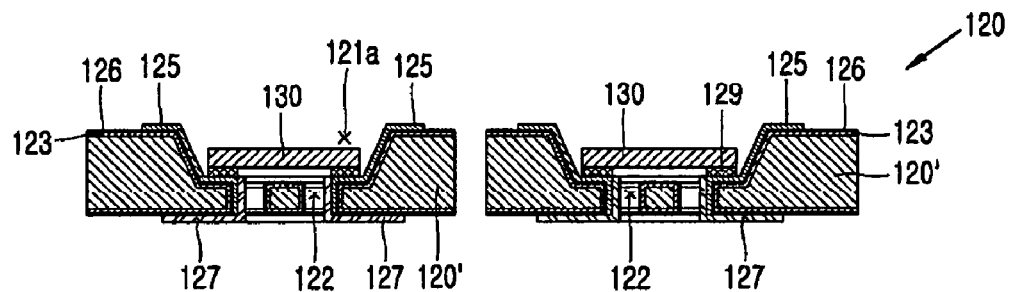

Next, as shown in FIG. 12, after the silicon substrate 120' is cut off by units of sub mount 120, the light emitting device 130 is appropriately positioned on the solder layer 129 and bonded to the solder layer 129 by heat processing. Here, the light emitting device 130 is bonded to the sub-mount 120 by a flip chip bonding method.

On the other hand, when bonding the light emitting device 130, not shown in the drawings, the solder layer 129 is not formed, the light emitting device is bonded to the first electrode by a method such as an Au stud bonding method, and then the silicon substrate can be cut off by units of sub-mount.

Figure 13:
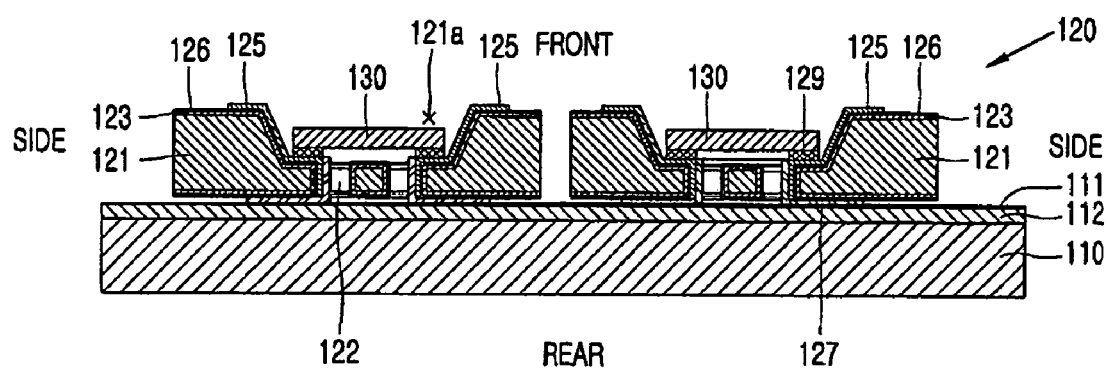

Next, as shown in FIG. 13, after the line pattern electrode 111 is formed at one surface of the stem 110, the sub-mount 120 is bonded to the stem 110 by using the flip chip bonding method in order to electrically connect the line pattern electrode 111 with the second electrode 127, thereby completing the light resource apparatus 100.

The completed light source apparatus 100 has not only excellent luminous efficiency because light generated from the light emitting device 100 does not disperse but is collected toward the front of the stem 110, but also very high heat radiation efficiency because heat generated from the light emoting device 130 does not pass by the sub-mount 120 but is directly transmitted to the stem 110, and then is radiated, so that a life span of the light emitting device 130 can be extended. Thus, the light source apparatus 100 can be effectively used in the backlight unit and the flash unit.

Meanwhile, FIGS. 14 to 17 show a sequential process of a method for fabricating a light source apparatus in accordance with a second embodiment of the present invention.

As shown therein, a method for fabricating a light source apparatus in accordance with a second embodiment of the present invention comprises: forming a groove 221a by bulk micro-machining of one surface of a silicon substrate 220' having an insulation layer 226 at its both sides; forming a first electrode 225 at one surface of the silicon substrate 220' having the groove 221a and the insulation layer 226; forming through holes 222 by bulk micro-machining of the silicon substrate 220' at its portion adjacent to the first electrode 225; forming a second electrode 227 at the other surface of the silicon substrate 220', the second electrode 227 penetrating through the through holes 222 and connecting with the first electrode 225; completing a sub-mount 220 by forming a solder layer 229 on the first electrode 225; bonding a light emitting device 230 to the solder layer 229 of the sub-mount 220; forming a line pattern electrode 211 on one surface of a stem 210; and completing a light source apparatus 200 by electrically bonding the second electrode 227 to the line pattern electrode 211 and mounting the sub-mount 220 onto the stem 210.

Figure 14:
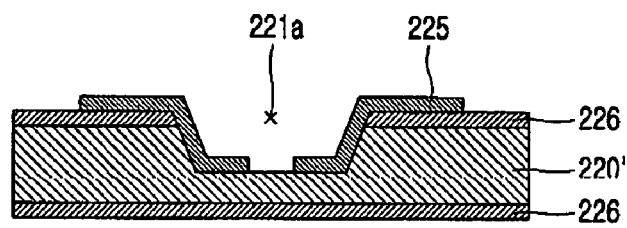
FIGS. 14 to 17 show a sequential process of a method for fabricating a light source apparatus in accordance with a second embodiment of the present invention.

As shown in FIG. 14, in the method for fabricating the light source apparatus in accordance with the second embodiment of the present invention, the groove 221a into which the light emitting device 230 is mounted is formed by bulk micro-machining of one surface of the silicon substrate 220' having the insulation layer 226 at its both sides, and the first electrode 225 is formed on one surface of the silicon substrate 220' having the groove 221a and the insulation layer 226.

Figure 15:
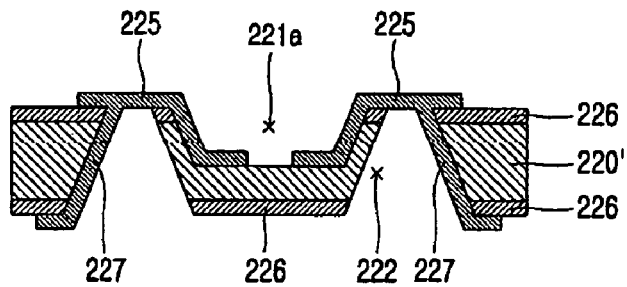

Next, as shown in FIG. 15, after the through holes 222 are formed by bulk micro-machining of the silicon substrate 220', the second electrode 227 is formed at the other surface of the silicon substrate 220' such that the second electrode 227 penetrates through the through hole 222 and connects with the first electrode 225. Here, the second electrode 227 is formed at a part of the insulation layer 225, preferably.

Figure 16:
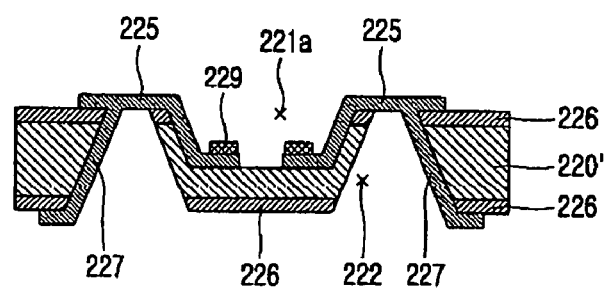

Next, as shown in FIG. 16, the sub-mount 220 is completed by forming solder layer 229 on the first electrode 225.

Figure 17:
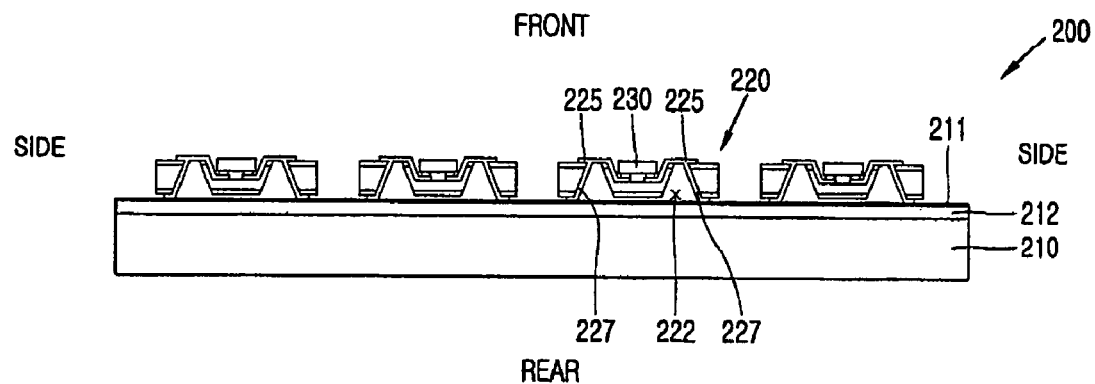

Next, as shown in FIG. 17, after the light emitting device 130 is bonded to the solder layer 229 of the sub-mount 220 by using the flip chip bonding method, by electrically connecting the second electrode 227 with the line pattern electrode 211, the sub-mount 220 is mounted onto the stem 210 having the line pattern electrode 211 and the insulation layer 212 by the flip chip bonding method, thereby completing the light source apparatus 200.

Meanwhile, FIGS. 18 to 22 show a sequential process of illustrating a method for fabricating a light source apparatus in accordance with a third embodiment of the present invention.

As shown therein, a method for fabricating a light source apparatus in accordance with the third embodiment of the present invention comprises: forming a groove 321a by removing a part of one surface of a silicon substrate 320' having an insulation layer 326 at its both surfaces by a bulk micro-machining method; forming through holes 322 by dry-etching a part of the groove 321a; forming a first electrode 325 on one surface of the silicon substrate 320' by passing through the first electrode 325; forming a second electrode 327 at the other surface of the silicon substrate 320', the second electrode 327 penetrating through the through holes 322 and connecting with the first electrode 325; completing a sub-mount 320 by forming a solder layer 329 on the first electrode 325; bonding a light emitting device 330 to the solder layer 329 of the sub-mount 320; forming a line pattern electrode 311 on one surface of the stem 310; and completing a light source apparatus 300 by electrically bonding the second electrode 327 to the line pattern electrode 311 and then mounting the sub-mount 320 onto the stem 310.

Figure 18:
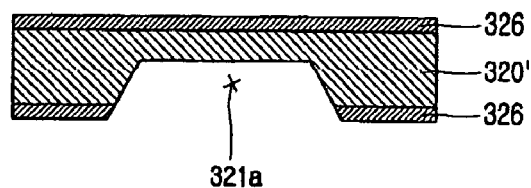
FIGS. 18 to 22 show a sequential process of a method for fabricating a light source apparatus in accordance with a third embodiment of the present invention.

As shown in FIG. 18, in the method for fabricating the light source apparatus in accordance with the third embodiment of the present invention, the part of one surface of the silicon substrate 320' which has the insulation layer 326 at its both sides is removed by the bulk micro-machining method to thereby form the groove 321a. At this time, the formed groove 321a is used to easily form the through holes 322 to be described later.

Figure 19:
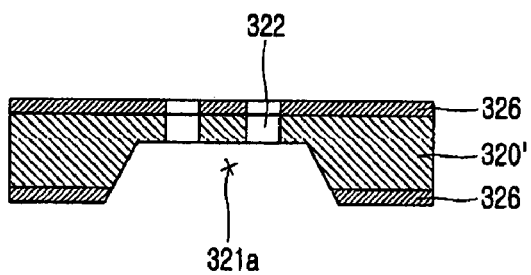

Next, as shown in FIG. 19, the part of the groove 321a is dry-etched to form the through holes 322.

Figure 20:
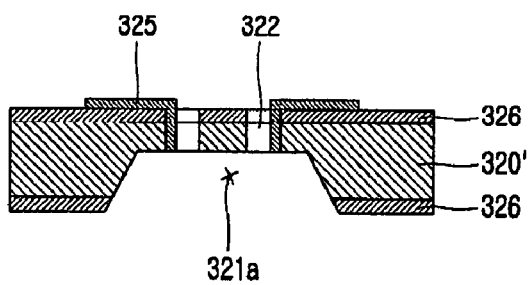

Next, as shown in FIG. 20, the first electrode 325 is formed at one surface of the silicon substrate 320' by penetrating through the through holes 322.

Figure 21:
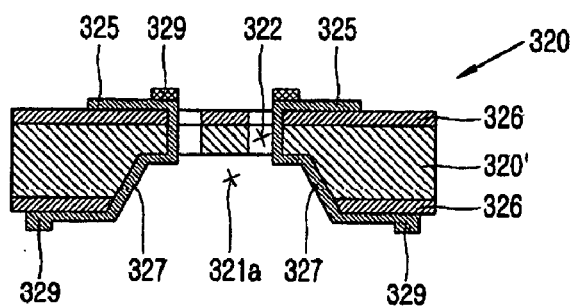

Next, as shown in FIG. 21, after the second electrode 327 is formed at the other surface of the silicon substrate 320' such that the second electrode 327 penetrates through the through holes 322 and connects with the first electrode 325, the sub-mount 320 is completed by forming the solder layer 329 on the first electrode 325.

Figure 22:
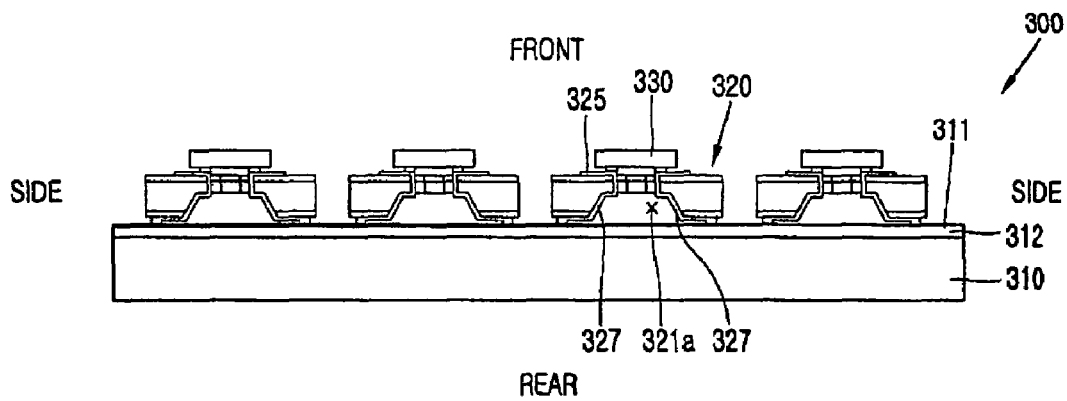
Figure 23:
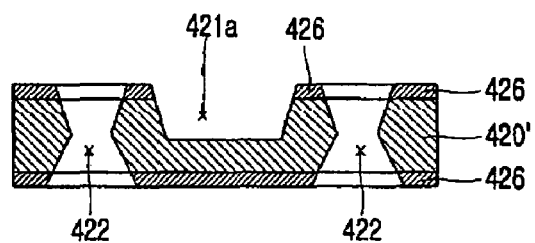
FIGS. 23 to 26 show a sequential process of a method for fabricating a light source apparatus in accordance with a fourth embodiment of the present invention.

Next, as shown in FIG. 22, the light emitting device 330 is bonded to the solder layer 329 of the sub-mount 320 by the flip chip bonding method. Then, the light source apparatus 300 is completed by mounting the sub-mount 320 onto the stem 310 having the line pattern electrode 311 and the insulation layer 312 at its one surface by electrically bonding the second electrode 327 to the line pattern electrode 311 by the flip chip bonding method.

The completed light source apparatus 300 can be used in the backlight unit and the flash unit.

Meanwhile, FIGS. 23 to 26 show a sequential process of a method for fabricating a light source apparatus in accordance with a fourth embodiment of the present invention.

As shown therein, a method for fabricating a light source apparatus in accordance with a fourth embodiment of the present invention comprises: forming a groove 421a by removing a part of one surface of a silicon substrate 420' having an insulation layer 426 at its both sides by a bulk micro-machining method and forming through holes 422 at both sides of the groove 421 at a certain interval from the groove 421; forming a first electrode 425 at one surface of the silicon substrate 420' by penetrating through the through holes 422; forming a second electrode 427 at the other surface of the silicon substrate 420', the second electrode 427 penetrating through the through holes 422 and connecting with the first electrode 425; forming a sub-mount 420 by forming a solder layer 429 on the first electrode 425; bonding a light emitting device 430 to the solder layer 429 of the sub-mount 420; forming a line pattern electrode 411 at one surface of the stem 410; and completing a light source apparatus 400 by electrically bonding the second electrode 427 to the line pattern electrode 411 and mounting the sub-mount 420 onto one surface of the stem 410.

In the method for fabricating the light source apparatus in accordance with the fourth embodiment of the present invention, the part of one surface of the silicon substrate 420' having the insulation layer 426 at its both ends is removed by the bulk micro-machining method to thereby form the groove 421*a*, and then the through holes 422 are formed at both sides of the groove 421*a* at a certain interval from the groove 421*a*.

Figure 24:
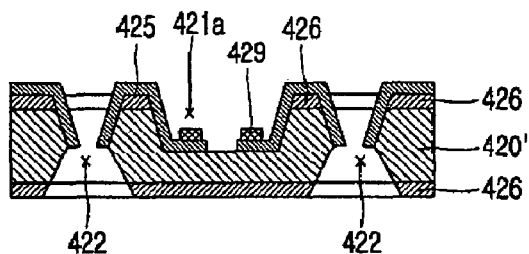

Next, as shown in FIG. 24, the first electrode 425 is formed at one surface of the silicon substrate 420' by penetrating through the through holes 422. At this time, the first electrode 425 extends from a portion of the through holes 422 to the groove 421*a*.

Figure 25:
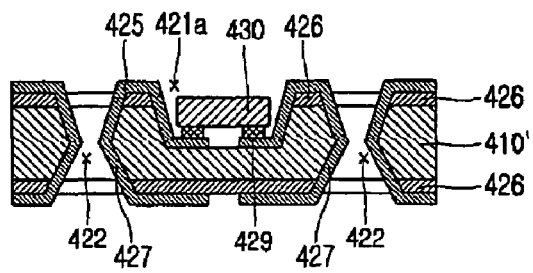

Next, as shown in FIG. 25, after the second electrode 427 is formed at the other surface of the silicon substrate 420' such that the second electrode 427 penetrates through the through hole 422 and connects with the first electrode 425, the solder layer 420 is formed on the first electrode 425 to thereby form the sub-mount 420.

Figure 26:
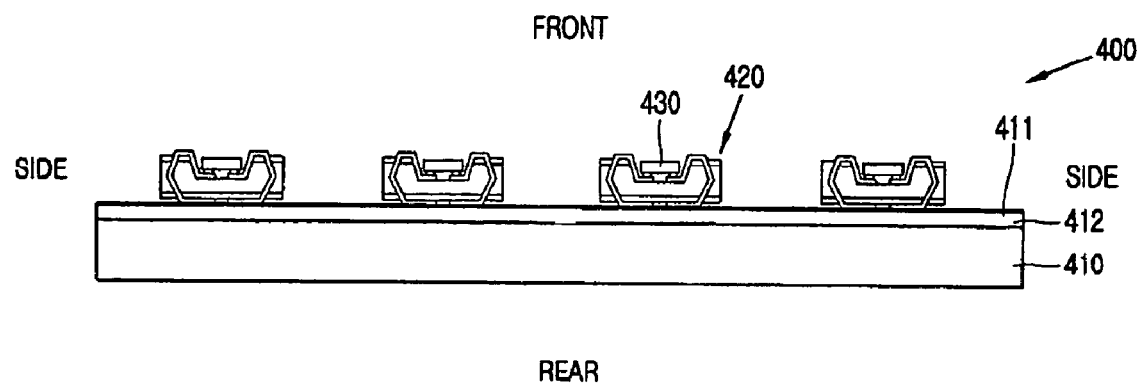

Next, as shown in FIG. 26, the light emitting device 430 is bonded to the solder layer 429 of the sub-mount 420 by the flip chip bonding method. Thereafter, the sub-mount 420 is mounted onto the stem 410 having the line pattern electrode 411 and the insulation layer 412 at its one surface by electrically connecting the second electrode 427 with the line pattern electrode 411, whereby the light source apparatus 400 is completed.

The completed light source apparatus 400 can be effectively used in a backlight unit and the flash unit.

As described so far, in the present invention, light interference occurring between the light emitting devices adjacent to each other by forming a groove on a sub-mount and mounting a light emitting device into the groove and the luminous efficiency is increased by collecting light emitted from the side of the light emitting device toward the front of the light source apparatus.

In addition, the process time and costs are reduced, reliability is increased, and heat radiation effect is increased by forming the through holes in the groove of the sub-mount and directly connecting the sub-mount to the stem by the first electrode and the second electrode passing through the through holes.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A light source apparatus comprising:
   a stem having a line pattern electrode at its one surface;
   a sub-mount provided with a body having a groove at its one surface and through holes formed inside the groove, a first electrode penetrating the through holes and formed at one surface of the body, a second electrode formed at the other side of the body so as to electrically connect with the first electrode and the line pattern electrode, and a solder layer formed on the first electrode; and
   a light emitting device inserted into the groove and bonded to the solder layer of the sub-mount,
   wherein a reflective layer, an insulation layer, the first electrode and the solder layer are sequentially formed on the sub-mount.

2. The apparatus of claim 1, wherein the depth of the groove is greater relatively to a length of the light emitting device.

3. The apparatus of claim 1, wherein the stem is an Metal Core Printed Circuit Board.

4. The apparatus of claim 1, wherein the light emitting device is an LED.

5. The apparatus of claim 1, wherein the insulation layer is deposited over the stem and the sub-mount is bonded to the insulation layer.

6. The apparatus of claim 1, wherein inclined surfaces are formed inside the groove such that light emitted from the side of the light emitting device can be collected toward the front of the stem.

7. The apparatus of claim 1 wherein the first electrode and the second electrode are formed at parts of the insulation layer.

8. The apparatus of claim 1, wherein the insulation layer is formed of one of AlN, ZnO, BeO, $SiO_2$ and SiNx.

9. The apparatus of claim 1, wherein the solder layer uses a material which can be bonded with the melting point of less than 400° C.

10. The apparatus of claim 1, wherein the solder layer is formed of one of Au—Sn, In, Pb, Pb—Sn and Ag—Sn.

* * * * *